(12) United States Patent
Hara et al.

(10) Patent No.: US 7,262,361 B2
(45) Date of Patent: Aug. 28, 2007

(54) SEMICONDUCTOR THIN FILM ELECTRODES MADE BY USING ORGANIC DYES AS THE PHOTOSENSITIZER AND PHOTOELECTRIC CONVERSION DEVICES

(75) Inventors: Kohjirou Hara, Tsukuba (JP); Kazuhiro Sayama, Tsukuba (JP); Hironori Arakawa, Tsukuba (JP); Sadaharu Suga, Tamano (JP); Akira Shinpo, Okayama-ken (JP); Yasuyo Ooga, Kurashiki (JP); Hajime Kusano, Okayama (JP)

(73) Assignee: National Institute of Advanced Industrial Science and Technology (JP)

( * ) Notice: Subject to any disclaimer, the term of this patent is extended or adjusted under 35 U.S.C. 154(b) by 416 days.

(21) Appl. No.: 10/415,552

(22) PCT Filed: Nov. 28, 2001

(86) PCT No.: PCT/JP01/10404

§ 371 (c)(1),
(2), (4) Date: May 1, 2003

(87) PCT Pub. No.: WO02/45199

PCT Pub. Date: Jun. 6, 2002

(65) Prior Publication Data
US 2004/0099306 A1     May 27, 2004

(30) Foreign Application Priority Data
Nov. 28, 2000  (JP)  .............................. 2000-361549

(51) Int. Cl.
*H01L 31/0216*  (2006.01)
(52) U.S. Cl. ..................... 136/263; 136/256; 257/40; 257/43; 257/431; 429/111; 429/212; 429/213

(58) Field of Classification Search ................ 136/256, 136/263; 257/40, 43, 431; 429/111, 212, 429/213
See application file for complete search history.

(56) References Cited

U.S. PATENT DOCUMENTS 4,052,536 A * 10/1977 Lichtin et al. ............... 429/105
(Continued)

FOREIGN PATENT DOCUMENTS
DE      198 09 840 A1    2/1998
(Continued)

OTHER PUBLICATIONS

Machine English Translation of JP 2000-223167 which published Aug. 2000.*
(Continued)

*Primary Examiner*—Nam Nguyen
*Assistant Examiner*—Anthony Fick
(74) *Attorney, Agent, or Firm*—Bacon & Thomas, PLLC

(57) ABSTRACT

A semiconductor film electrode using a specific organic dye sensitizer, a high efficiency dye-sensitized photovoltaic conversion element using the electrode, and a dye-sensitized photoelectrochemical solar cell using the element are described. The semiconductor film electrode is characterized by including a semiconductor sensitized with an organic dye having a structure represented by the following formula (1):

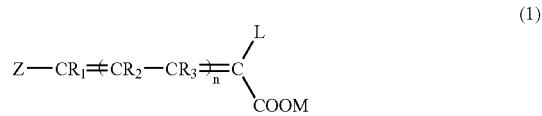

wherein Z represents a heterocyclic group which may have a substituent, L represents an electron attractive group, $R_1$-$R_3$ each represent a hydrogen atom or a substituent or adjacent two of $R_1$-$R_3$ are taken in combination to represent a ring, M represents a hydrogen atom or a salt-forming cation, and n is an integer of 0 to 3.

6 Claims, 2 Drawing Sheets

U.S. PATENT DOCUMENTS

| | | | |
|---|---|---|---|
| 4,764,622 A | * | 8/1988 | Claussen et al. ............. 548/159 |
| 6,603,140 B2 | * | 8/2003 | Kobori et al. ................. 257/40 |
| 2003/0152827 A1 | * | 8/2003 | Ikeda et al. ................... 429/111 |
| 2005/0236036 A1 | * | 10/2005 | Ohtaka et al. ............... 136/263 |

FOREIGN PATENT DOCUMENTS

| | | |
|---|---|---|
| EP | 0 924 724 A2 | 6/1999 |
| EP | 1 083 582 A2 | 6/2000 |
| JP | 59-218779 A * | 12/1984 |
| JP | 61056175 | 3/1986 |
| JP | 10-93118 | 4/1998 |
| JP | 911841 A2 * | 4/1999 |
| JP | 11-214731 | 8/1999 |
| JP | 2000-106224 | 4/2000 |
| JP | 2000-223167 | 8/2000 |
| JP | 2000268892 | 9/2000 |
| WO | 94/05025 | 3/1994 |

OTHER PUBLICATIONS

Hara et al, "A coumarin-derivative dye sensitized nanocrystalline TiO2 solar cell having a high solar-energy conversion efficiency up to 5.6%", Chem. Commun., pp. 569-570, Mar. 6, 2001.*

Hara et al, "Design of new coumarin dyes having thiophene moieties for highly efficient organic-dye-sensitized solar cells," New J. Chem., vol. 27, pp. 783-785, (2003).*

C. Geoffroy-Chapotot et al; Synthesis and Photophysical Characteristics of Novel Molecular Rotor Fluorescent Dyes Derived From Coumarins; Recents Proges En Genie Des Procedes; vol. 12(61); 1998, pp. 31-36.

Kudo K. Et al; Photovoltaic Effects of Merocyanine-ZnO Cells; Japanese Journal of Applied Physics, Tokyo, JP, vol. 19, No. 11, Nov. 1980; pp. L683-L685.

* cited by examiner

SEMICONDUCTOR THIN FILM ELECTRODES MADE BY USING ORGANIC DYES AS THE PHOTOSENSITIZER AND PHOTOELECTRIC CONVERSION DEVICES

CROSS-REFERENCE TO RELATED APPLICATION

This application is a National Phase Application (35 USC 371) of PCT/JP01/10404 and claims priority of Japanese Application No. 2000-361549 filed Nov. 28, 2000.

TECHNICAL FIELD

The present invention relates to a semiconductor film electrode using an organic dye as a photosensitizer, to a photovoltaic conversion element and to a photoelectrochemical solar cell using the electrode.

BACKGROUND ART

High efficiency dye-sensitized photovoltaic conversion elements including an oxide semiconductor film electrode sensitized with a complex of a metal such as ruthenium or an organic dye, and a redox electrolyte have been reported. An application of such an element to photoelectrochemical solar cells is now attractive because of high photovoltaic conversion efficiency thereof and capability of manufacture thereof at a low cost.

Organic dyes which have been hitherto used as a sensitizing dye in dye-sensitized photoelectrochemical solar cell include a phenylxanthene dye, a phthalocyanine dye, a coumarin dye, a cyanine dye, porphyrin dye, an azo dye and a proflavine dye. While these organic dyes have a larger absorbance and cheaper as compared with metal complexes and are advantageous as a photosensitizer for reasons of capability of controlling absorption characteristics due to their diversity in structure, the wavelength of light absorbed by these dyes is limited to a relatively short wavelength region so that solar energy transfer efficiency thereof is much lower than that of metal complex such as a ruthenium complex.

It is an object of the present invention to provide a semiconductor film electrode using a specific organic dye sensitizer, a high efficiency dye-sensitized photovoltaic conversion element using the electrode, and a dye-sensitized photoelectrochemical solar cell using the element.

SUMMARY OF THE INVENTION

The present inventors have made an earnest study with a view toward solving the above problems and, as a result, have completed the present invention.

In accordance with the present invention there are provided a semiconductor film electrode, a photovoltaic conversion element using the electrode and a photoelectrochemical solar cell using the element as follows:

(1) A film electrode comprising a semiconductor sensitized with an organic dye having a structure represented by the following formula (1):

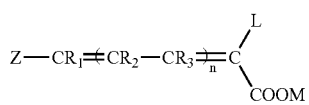

wherein Z represents a heterocyclic group which may have a substituent, L represents an electron attractive group, $R_1$-$R_3$ each represent a hydrogen atom or a substituent or adjacent two of $R_1$-$R_3$ are taken in combination to represent a ring, M represents a hydrogen atom or a salt-forming cation, and n is an integer of 0 to 3.

(2) A film electrode comprising a semiconductor sensitized with an organic dye having a structure represented by the following formula (2):

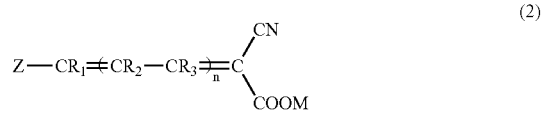

wherein Z, $R_1$-$R_3$, M and n have the same meaning as above.

(3) A film electrode comprising a semiconductor sensitized with an organic dye having a structure represented by the following formula (3):

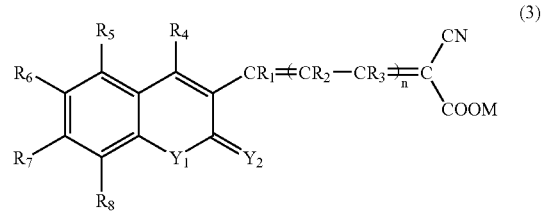

wherein $R_1$-$R_8$ each represent a hydrogen atom or a substituent or adjacent two of $R_1$-$R_8$ are taken in combination to represent a ring, $Y_1$ and $Y_2$ each represent a heteroatom, M represents a hydrogen atom or a salt-forming cation, and n is an integer of 0 to 3.

(4) A film electrode comprising a semiconductor sensitized with an organic dye having a structure represented by the following formula (4):

wherein $Z_1$ represents a heterocyclic group which may have a substituent, L represents an electron attractive group, $R_1$-$R_2$ each represent a hydrogen atom or a substituent or $R_1$-$R_2$ are taken in combination to represent a ring, M represents a hydrogen atom or a salt-forming cation, and n is an integer of 0 to 3.

(5) A film electrode comprising a semiconductor sensitized with an organic dye having a structure represented by the following formula (5):

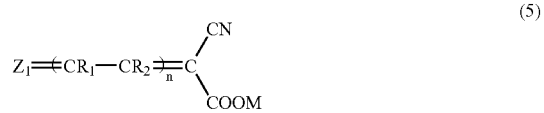

wherein Z, $R_1$-$R_2$, M and n have the same meaning as above.

(6) A film electrode comprising a semiconductor sensitized with an organic dye having a structure represented by the following formula (6):

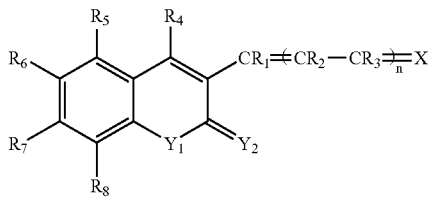

(6)

wherein $R_1$-$R_8$ each represent a hydrogen atom or a substituent or adjacent two of $R_1$-$R_8$ are taken in combination to represent a ring, X represents a heterocyclic group having at least one anionic group or anionic group-containing group and at least two heteroatoms, $Y_1$ and $Y_2$ each represent a heteroatom, and n is an integer of 0 to 3.

(7) A film electrode comprising a semiconductor sensitized with an organic dye having a structure represented by the following formula (7):

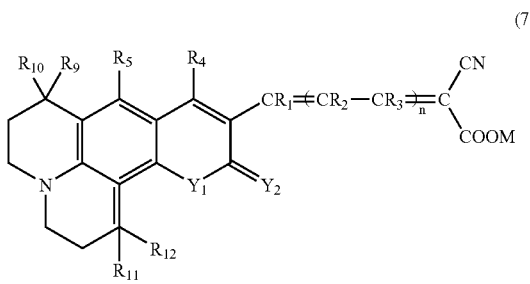

(7)

wherein $R_1$-$R_5$ each represent a hydrogen atom or a substituent or adjacent two of $R_1$-$R_3$ are taken in combination to represent a ring, $R_9$-$R_{12}$ each represent a hydrogen atom or an alkyl group having 1 to 6 carbon atoms, $Y_1$ and $Y_2$ each represent a heteroatom, M represents a hydrogen atom or a salt-forming cation, and n is an integer of 0 to 3.

(8) A photovoltaic conversion element characterized by using a film electrode according to any one of (1) to (7).
(9) A photoelectrochemical solar cell characterized by using a photovoltaic conversion element according to (8).

In the above general formula (1), Z represents a heterocyclic group which may have a substituent. The heterocyclic group may be any group derived from various known heterocycles. The heteroatom(s) contained in the heterocycle may be an oxygen atom, a sulfur atom, a nitrogen atom, or the like. The number of the heteroatom is 1 or a plural (2-5). When two or more heteroatoms are contained in the ring, the heteroatoms may be the same or different. To the heterocycle may be fused a 6-12 membered carbon ring such as a benzene ring, a naphthalene ring or cyclohexane ring or a 5-12 membered heteroring such as a durolidine ring.

Specific examples of the heterocycle include thiazole, benzothiazole, oxazole, benzoxazole, selenazole, benzoselenazole, indole, coumarin and phenylxanthene.

One or a plurality of substituensts may be linked to the heterocycle. Examples of such substituent include linear or branched alkyl groups having 1-22 carbon atoms, preferably 2-18 carbon atoms, such as a methyl group, an ethyl group, an octyl group, an octadecyl group and a 2-ethylhexyl group; alkoxy groups having 1-22 carbon atoms, preferably 1-18 carbon atoms, such as a methoxy group, a propoxy group and a butoxy group; aryl groups having 6-22 carbon atoms, preferably 6-12 carbon atoms, such as a phenyl group and a naphthyl group; aralkyl groups having 7-22 carbon atoms, preferably 7-12 carbon atoms, such as a benzyl group; a hydroxyl group; a cyano group; a nitro group; halo groups such as chloro group, a bromo group and an iodo group; a trifluoromethyl group; an amino group; monoalkylamino groups having 1-22 carbon atoms, preferably 1-12 carbon atoms, such as a methylamino group and an octylamino group; dialkylamino groups having 1-22 carbon atoms, preferably 1-12 carbon atoms, such as a diethylamino group, a dibutylamino group and a dioctadecylamino group; and cyclic amino groups having 5-8, preferably 5-6 ring-forming elements, such as a piperidyl group or a morpholyl group.

In the general formula (1), L represents an electron attracting group. Various customarily employed electron attracting groups may be used. Examples of the electron attracting group include a cyano group; a nitro group; a halo group such as a chloro group, a bromo group or an iodo group; a hydroxyl group; a trifluoromethyl group; a sulfonic acid group; a carboxyl group; and an alkoxycarboxyl group.

In the above general formula (1), $R_1$, $R_2$ and $R_3$ each represent a hydrogen atom or a substituent. The substituent may include various customarily employed substituent groups which can be bonded to a carbon atom. Examples of the substituent include a hydroxyl group; linear or branched alkyl groups having 1-12 carbon atoms, preferably 1-6 carbon atoms, such as a methyl group, an ethyl group, an octyl group, an octadecyl group and a 2-ethylhexyl group; halo groups such as a chloro group, a bromo group and an iodo group; a nitro group; a cyano group; an amino group; an amino group; monoalkylamino groups having 1-12 carbon atoms, preferably 1-6 carbon atoms, such as a methylamino group and an octylamino group; dialkylamino groups having 1-12 carbon atoms, preferably 1-6 carbon atoms, such as a diethylamino group, a dibutylamino group and a dioctadecylamino group; and a trifluoromethyl group.

Adjacent two of $R_1$-$R_3$, when taken in combination, may represent a ring which can be a carbon ring or a heteroring containing 5-10, preferably 5-8 elements. In the case of a heteroring, one or a plurality of heteroatoms (an oxygen atom, a sulfur atom, a nitrogen atom, etc.) are contained in the elements constituting the heteroring.

In the above general formula (1), M represents a hydrogen atom or a salt-forming cation. Various salt-forming cations capable of forming a salt with a carboxyl group may be used. Examples of the salt-forming cation include an ammonium cation ($NH_4^+$); organic ammonium cations derived from amines ($A_1A_2A_3A_4N^+$ wherein $A_1$-$A_4$ each represent a hydrogen atom or an alkyl or alkenyl group having 1-22 carbon atoms with the proviso that at least one of $A_1$-$A_4$ is an alkenyl group); an alkali metal ion such as $Li^+$, $Na^+$, $K^+$ and $Cs^+$; and an alkaline earth metal ion such as $Mg^{2+}$, $Ca^{2+}$ and $Sr^{2+}$.

In the above general formula (1), n is an integer of 0-3, preferably 1-2.

In the above general formula (2), Z, $R_1$, $R_2$, $R_3$, M and n have the same meaning as above.

In the above general formula (3), $R_1$-$R_8$ each represent a hydrogen atom or a substituent. As the substituents, there may be used various substituents described above with reference to $R_1$-$R_3$. M and n have the same meaning as above.

In the above general formula (3), $Y_1$ represents a heteroatom such as an oxygen atom (—O—), a sulfur atom (—S—), a nitrogen atom (—NH—, —NR— where R is an alkyl group having 1-6 carbon atoms), a selenium atom (—Se—) or a tellurium atom (—Te—). $Y_2$ represents a heteroatom such as an oxygen atom (=O), a sulfur atom (=S), a nitrogen atom (=NR where R is an alkyl group having 1-6 carbon atoms), a selenium atom (=Se) or a tellurium atom (=Te).

In the above general formula (4), $Z_1$ represents a divalent heterocyclic group which may have a substituent. The heterocyclic group may be any group derived from various known heterocycles. The heteroatom(s) contained in the heterocycle may be an oxygen atom, a sulfur atom, a nitrogen atom, or the like. The number of the heteroatom is 1 or a plural (2-5). When two or more heteroatoms are contained in the ring, the heteroatoms may be the same or different. To the heterocycle may be fused a 6-12 membered carbon ring such as a benzene ring, a naphthalene ring or cyclohexane ring or a 5-12 membered heteroring such as a durolidine ring. The heterocyclic group may have one or a plurality of substituents which may be those described above.

Examples of the heterocyclic groups include rhodanine, thiazolin, benzothiazolin, thiobarbituric ring, oxazolidone and thioxazolidone.

In the above general formula (4), $R_1$, $R_2$, L, M and n have the same meaning as above.

In the above general formula (5), $Z_1$, $R_1$, $R_2$, M and n have the same meaning as above.

In the above general formula (6), $R_1$-$R_8$, $Y_1$, $Y_2$ and n have the same meaning as above.

In the above general formula (6), X represents a heterocyclic group having at least one anionic group. The heterocyclic group may be one derived from 5-membered or 6-membered heterocycle containing at least 2 heteroatoms. To the heterocycle may be fused an aromatic ring such as a benzene ring or a naphthalene ring. Examples of the heterocyclic groups include rhodanine, thioxazolidone, thiohidantoin, thiobarbituric ring, thiazolin, benzothiazolin and oxazoline.

Specific examples of the heterocyclic group X are shown below:

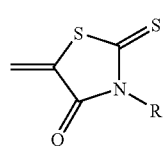

(8)

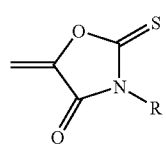

(9)

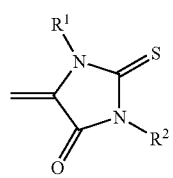

(10)

-continued

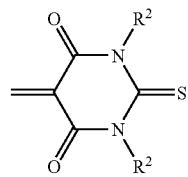

(11)

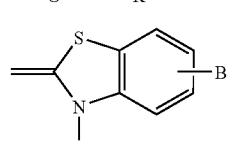

(12)

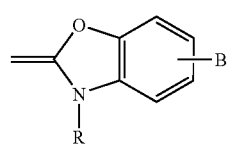

(13)

wherein R represents an anionic group or an anionic group-containing group, $R_1$ and $R_2$ each represent a hydrogen atom, an anionic group, an anionic group-containing group or a substituent, with the proviso at least one of $R_1$ and $R_2$ represents an anionic group or an anionic group-containing group.

The substituent may be any group capable of bonding to a nitrogen atom. Examples of the substituent include alkyl and alkenyl groups having 1-22 carbon atoms, preferably 2-18 carbon atoms, cycloalkyl groups having 5-8 carbon atoms, aryl groups having 6-22 carbon atoms, preferably 6-12 carbon atoms, and aralkyl groups having 7-22 carbon atoms, preferably 7-12 carbon atoms. These groups may further contain a substituent such as a hydroxyl group, a carboxyl group, a sulfonic acid group, a phosphoric acid group, an alkoxy group, an alkoxycarbonyl group, an acyl group or a halogen atom.

The anionic group-containing group (a group having an anionic group as its substituent) may be represented by the following general formula (14):

$$—A^1—X^1 \quad (14)$$

wherein $A^1$ represents a divalent hydrocarbyl group and $X^1$ represents an anionic group.

The divalent hydrocarbyl group $A^1$ may be, for example, an alkylene group having 1-6 carbon atoms, preferably 1-3 carbon atoms, such as ethylene, propylene or butylene; an arylene group having 6-12 carbon atoms such as phenylene, tolylene or naphthylene; or an arylenedialkylene group such as phenylenedimethylene or phenylenediethylene.

The anionic group $X^1$ may be, for example, a carboxyl group, a sulfonic acid group or a phosphoric acid group. The anionic group may be in a free state or a neutral state neutralized with a cation M. These anionic groups serve to function as an anchor group for adsorbing to a surface of a semiconductor.

Examples of the anionic group include —COOH, —CH$_2$COOH, —C$_2$H$_4$COOH, —C$_3$CH$_6$COOH, —C$_6$H$_4$COOH, —SO$_3$H, —C$_2$H$_4$SO$_3$H, —C$_6$H$_4$SO$_3$H, —PO$_3$H$_2$, —COONa, —SO$_3$Na and —PO$_3$HNa.

B indicated above represents a hydrogen atom or a substituent. The previously described various substituents may be used as the substituent.

In the above general formula (7), $R_1$-$R_5$, $Y_1$, $Y_2$, M and n have the same meaning as above. $R_9$, $R_{10}$, $R_{11}$ and $R_{12}$ each represent a hydrogen atom or an alkyl group having 1-12 carbon atoms, preferably 1-6 carbon atoms.

DESCRIPTION OF THE PREFERRED EMBODIMENTS

Figure 1:
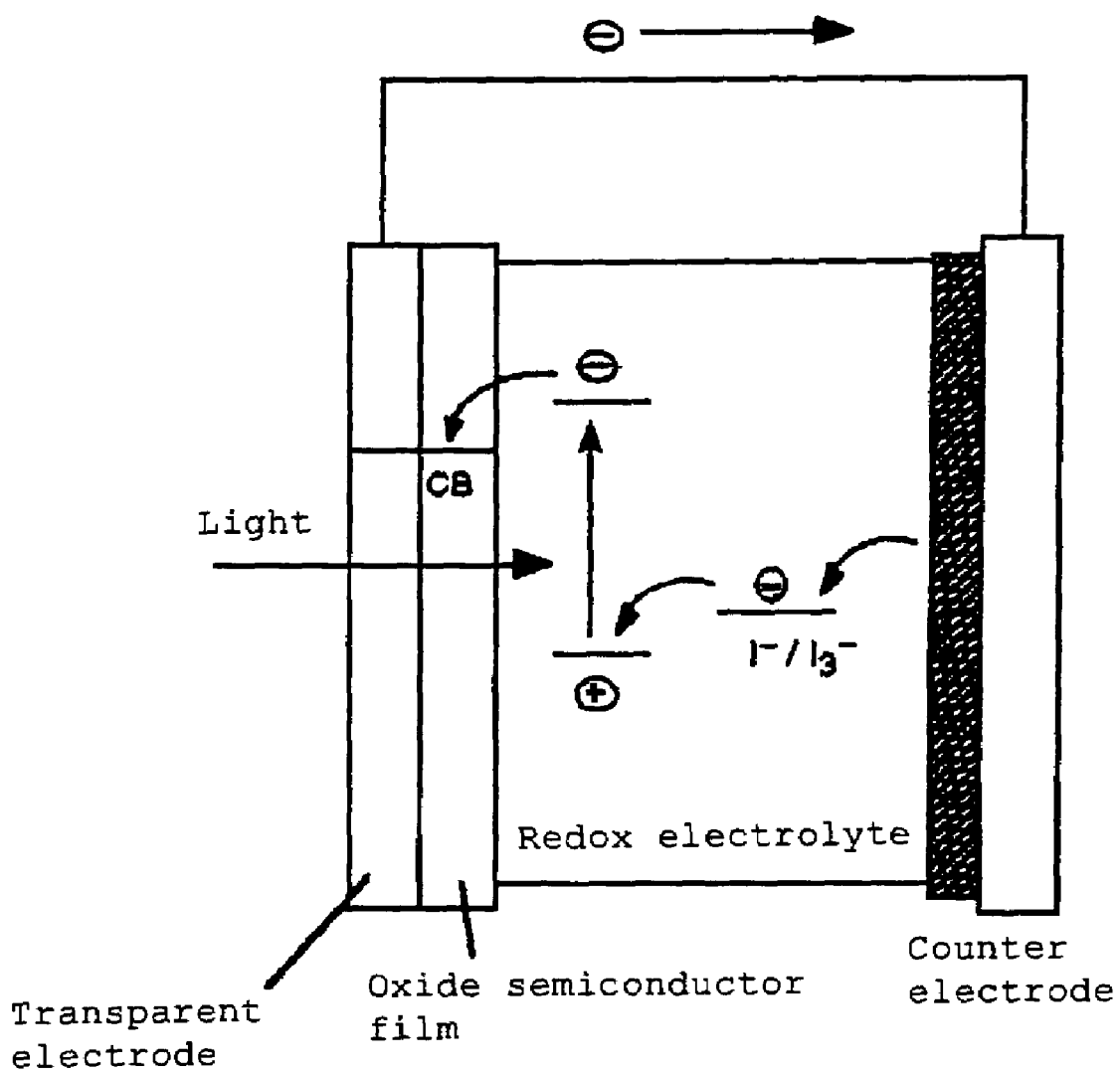
FIG. 1 is a schematic illustration of one embodiment of a photovoltaic conversion element of the present invention.

Illustrative of compounds (organic dyes) represented by the above general formulas (1)-(7) are shown below:

No. 1
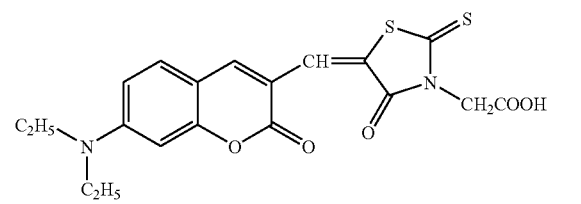

No. 2
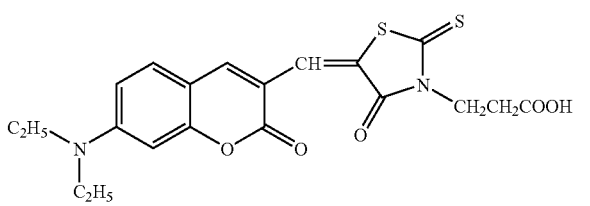

No. 3
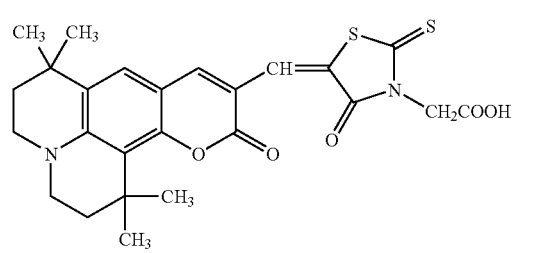

No. 4
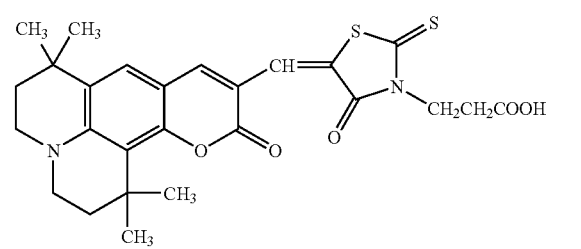

No. 5
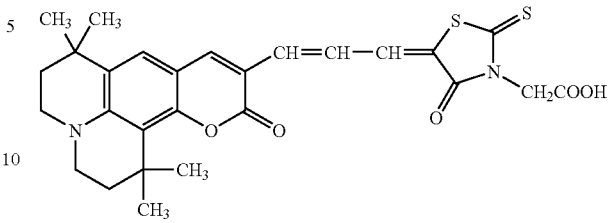

No. 6
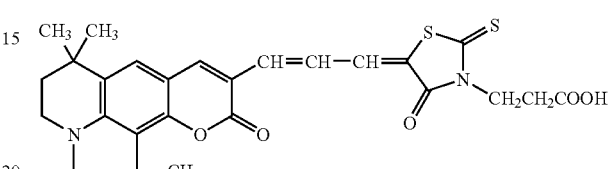

No. 7
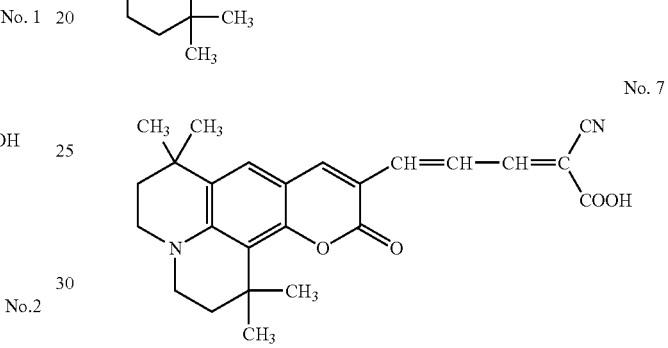

No. 8
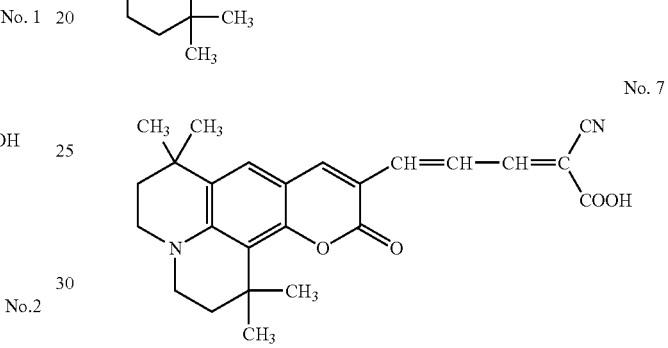

No. 9
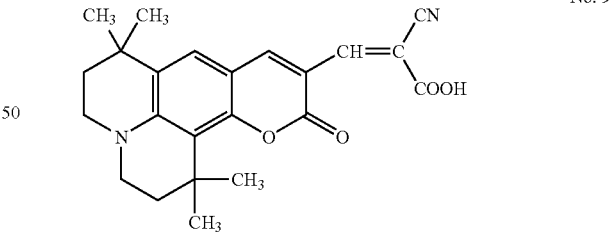

No. 10
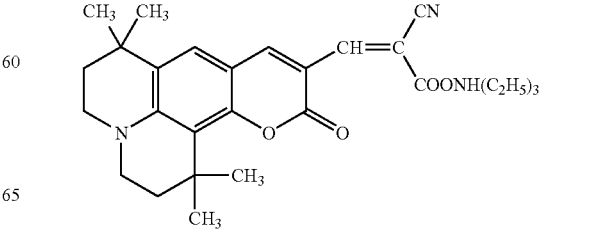

-continued
No. 11
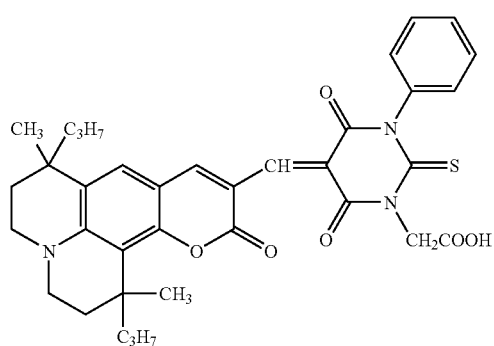
No. 12
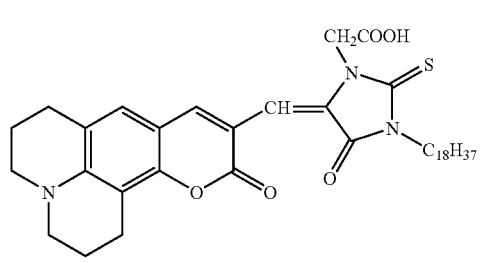
No. 13
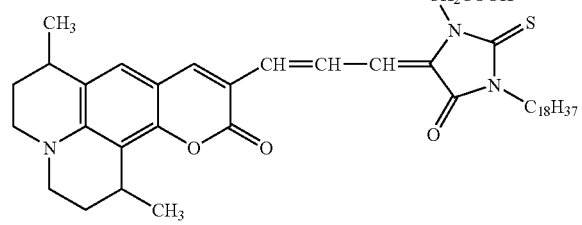
No. 14
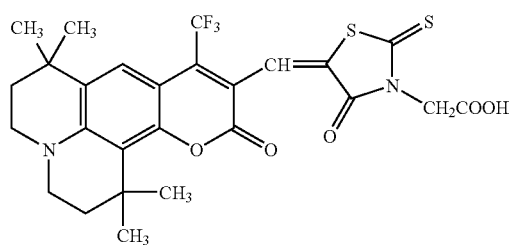
No. 15
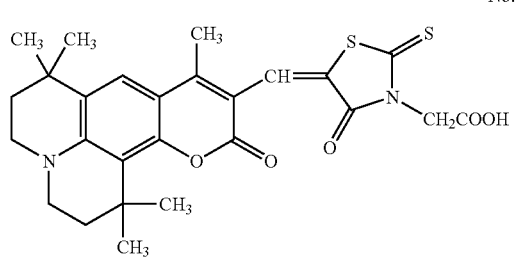
-continued
No. 16
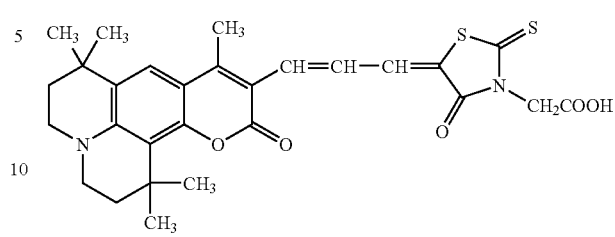
No. 17
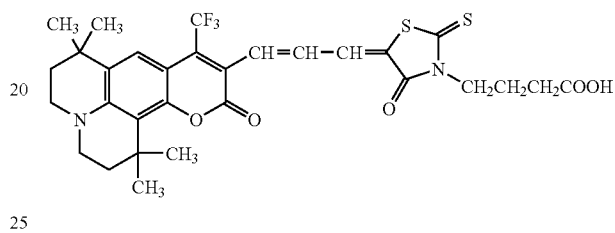
No. 18
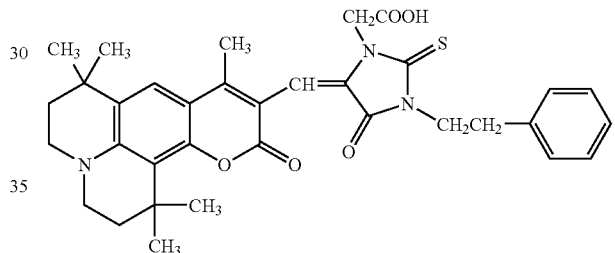
No. 19
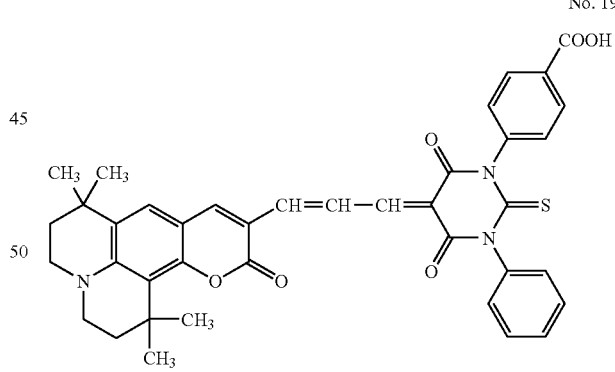
No. 20
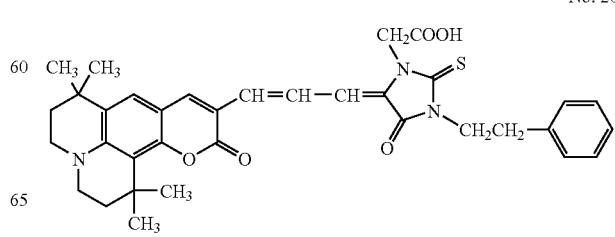

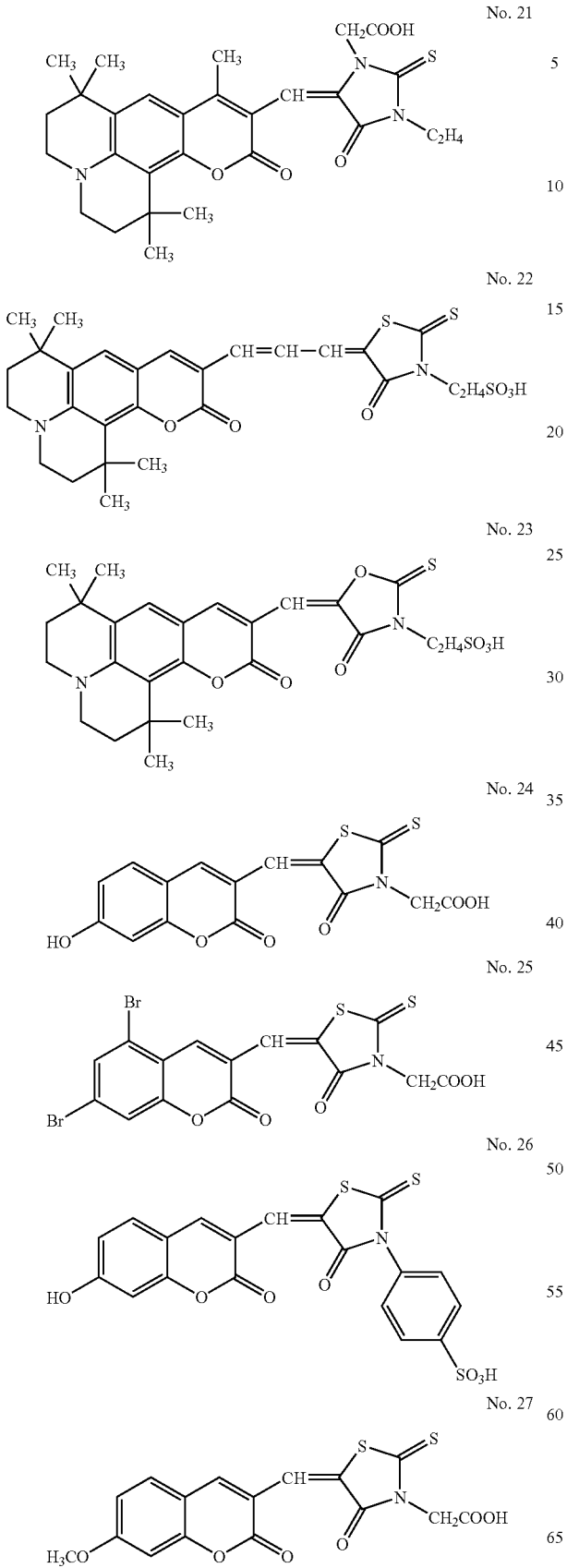
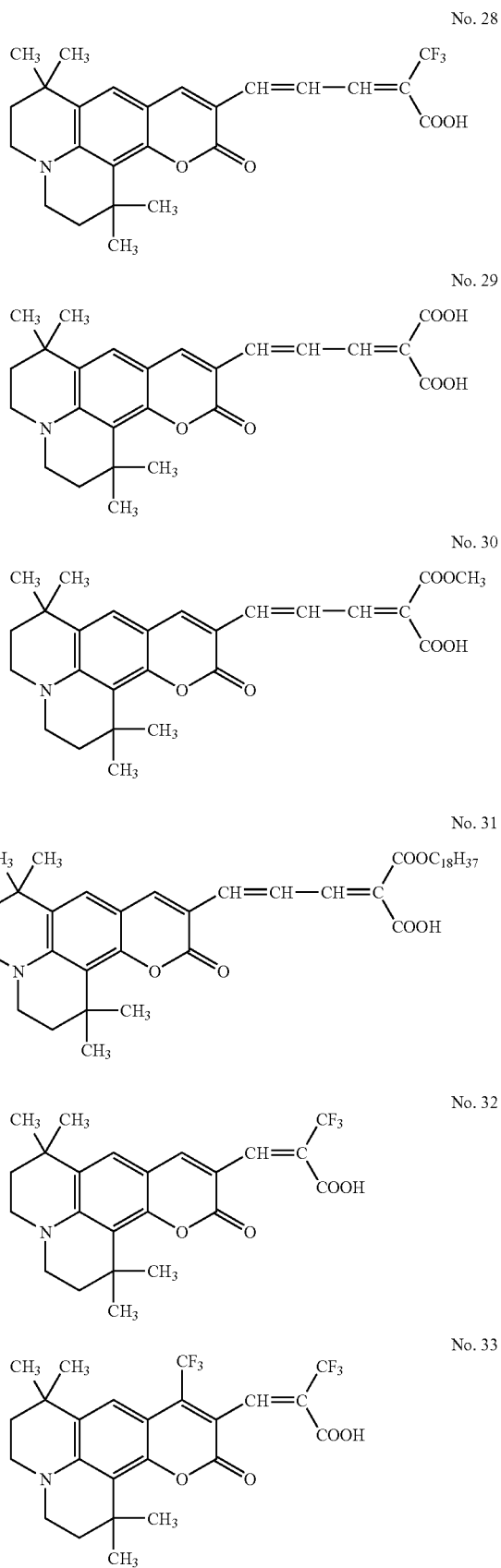

-continued
No. 34
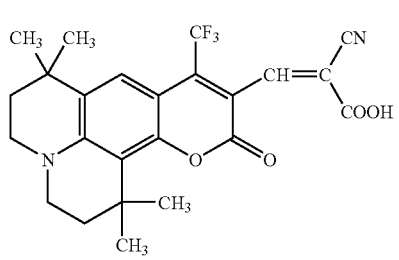
No. 35
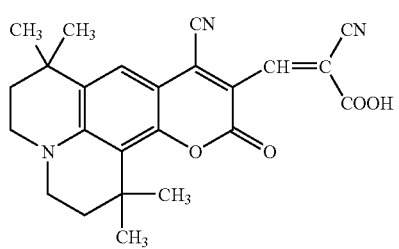
No. 36
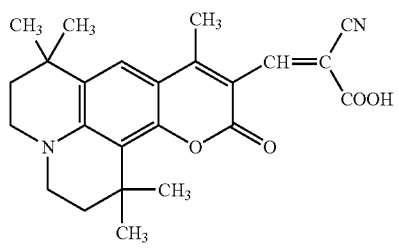
No. 37
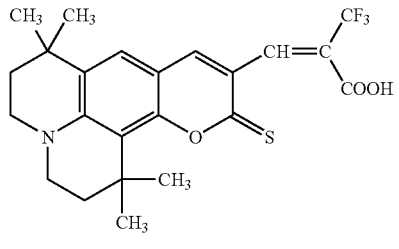
No. 38
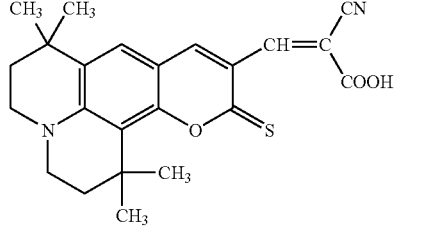
No. 39
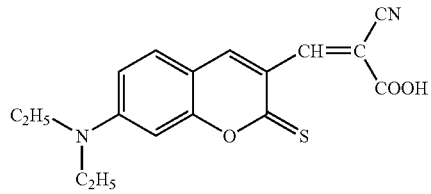
-continued
No. 40
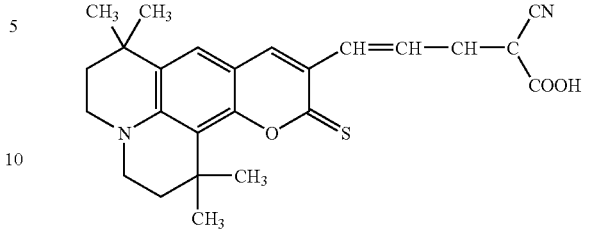
No. 41
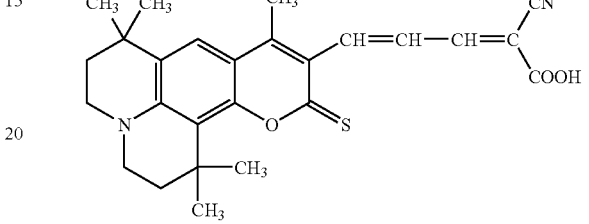
No. 42
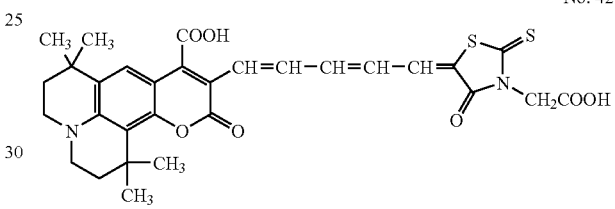
No. 43
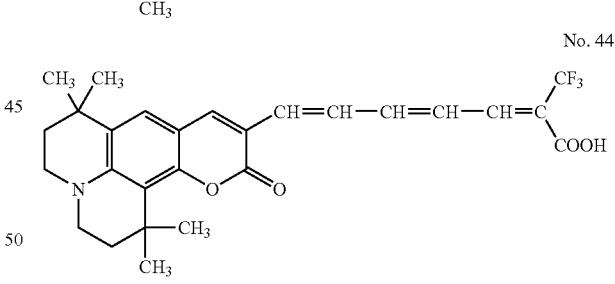
No. 44
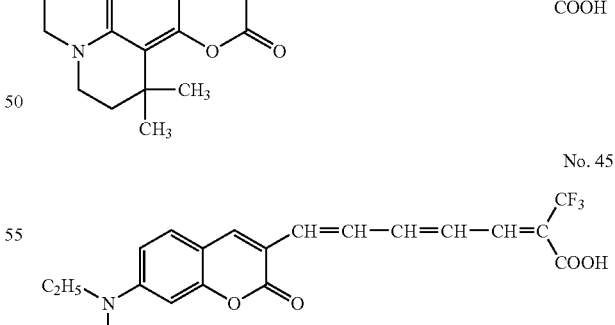
No. 45
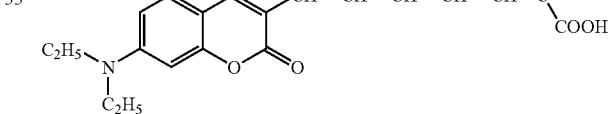
No. 46
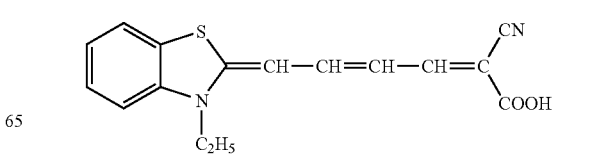

No. 47 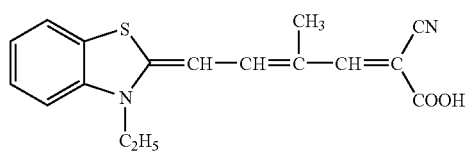

No. 48 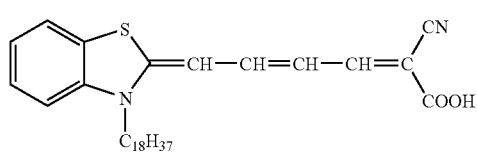

No. 49 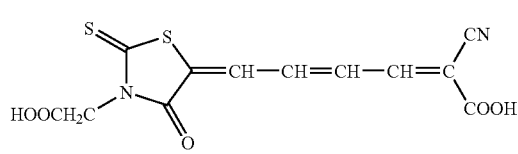

No. 50 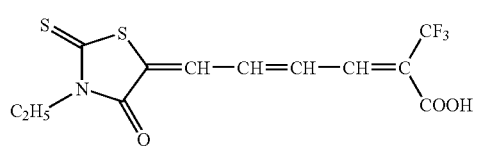

No. 51 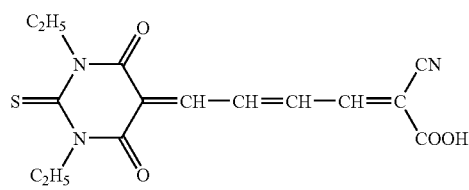

No. 52 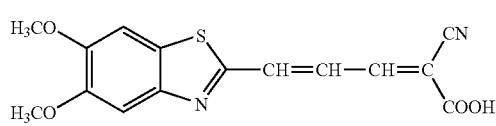

No. 53 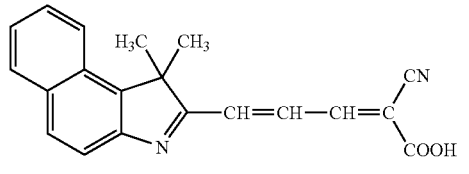

No. 54 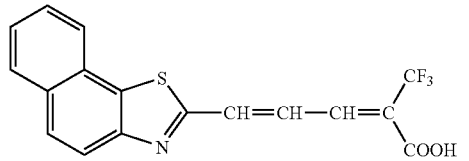

The compound represented by the above general formula (1) may be prepared by reacting a heterocyclic aldehyde represented by the formula (15) shown below with a substituted acetic acid represented by the formula (16) shown below:

(15)

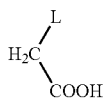
(16)

wherein Z, $R_1$, $R_2$, $R_3$, n and L have the same meaning as above.

The compound represented by the above general formula (4) may be prepared by reacting a heterocyclic aldehyde represented by the formula (17) shown below with a substituted acetic acid represented by the formula (16) shown above:

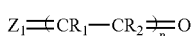
(17)

wherein $Z_1$, $R_1$, $R_2$ and n have the same meaning as above.

The compound represented by the above general formula (6) may be prepared by reacting a heterocyclic aldehyde corresponding to the compound with a heterocyclic compound having at least one anionic group or an anionic group-containing group and containing at least two heteroatoms.

A semiconductor film electrode sensitized with an organic dye of the present invention may be obtained by using the organic dye of the present invention in a conventionally known organic dye-sensitized semiconductor electrode.

An organic dye-sensitized semiconductor film electrode according to the present invention may be suitably prepared by providing a transparent electrode, laminating a semiconductor film thereon, and adsorbing the organic dye of the present invention to the semiconductor film.

As the transparent electrode, any conductive material may be used. There may be used, for example, a transparent electrode having a transparent or translucent glass substrate or plastic plate coated with a transparent conductive oxide semiconductor film such as a fluorine—or antimony-doped tin oxide (NESA) or a tin-doped indium oxide (ITO) or zinc oxide, preferably with an antimony-doped tin oxide film.

The semiconductor film to be used in the present invention may be formed of a compound semiconductor material composed of nanoparticles (particle size: 5-2000 nm) and having a nanoporous structure. Such a material may be, for example, a single metal oxide such as titanium oxide, indium oxide, tin oxide, bismuth oxide, zirconium oxide, tantalum oxide, niobium oxide, tungsten oxide, iron oxide, gallium oxide or nickel oxide; a complex oxide such as strontium titanate, barium titanate, potassium niobate or sodium tantalate; a chalcogenide compound such as zinc sulfide, titanium sulfide, indium sulfide, bismuth sulfide, cadmium sulfide, zirconium sulfide, tantalum sulfide, silver sulfide, copper sulfide, tin sulfide, tungsten sulfide, molybdenum sulfide, cadmium selenide, zirconium selenide, zinc selenide, titanium selenide, indium selenide, tungsten selenide, molybdenum selenide, bismuth selenide, cadmium telluride, tungsten telluride, molybdenum telluride, zinc telluride or bismuth telluride; a mixed compound semiconductor material containing two or more of the above compounds such as tin oxide/zinc oxide or tin oxide/titanium oxide. The semiconductor film of the present invention is not limited to the above examples.

The thickness of the semiconductor film is 0.1-100 μm, preferably 8-20 μm.

The organic dye may be adsorbed on the semiconductor film by a method in which the semiconductor film is immersed in an organic dye solution at room temperature for 1 minute to 2 days or at an elevated temperature for 1 minute to 24 hours, preferably at room temperature for more than 12 hours.

The solvent used for adsorbing the organic dye on the semiconductor film may be any solvent as long as it can dissolve the organic dye. Examples of the solvent include an alcohol solvents such as methanol, ethanol, isopropanol and t-butanol; hydrocarbon solvents such as benzene; organic solvents such as tetrahydrofuran and acetonitrile; and mixed solvents of the above solvents.

The dye solution used for adsorbing the organic dye on the semiconductor film has a concentration of 0.01 mM to saturation amount, preferably 0.1-0.5 mM.

A photovoltaic conversion element according to the present invention comprises a semiconductor film electrode having adsorbed thereon the organic dye, a counter electrode, and a redox electrolyte in contact with these electrodes and may be easily obtained by using the above semiconductor film having adsorbed thereon the dye of the present invention in a conventionally known photovoltaic conversion element.

FIG. 1 schematically depicts one embodiment of a photovoltaic conversion element of the present invention. As shown in the schematic illustration, the photovoltaic conversion element of the present invention is composed of a nanoporous semiconductor film electrode having provided thereon a conductive transparent electrode (such as glass coated with tin oxide), a counter electrode and an electrolyte containing a redox electrolyte. The organic dye sensitizer is adsorbed on surfaces of the semiconductor nanoparticles. Upon irradiation of a light from the dye-adsorbed semiconductor film electrode, the organic dye adsorbed on the nanoporous semiconductor electrode absorbs ultraviolet light, visible light, near infrared light, etc. (the absorption wavelength region depends upon the kind of the organic dye). The excited electrons in the dye are implanted to the conduction band energy level of the semiconductor. The electrons then move through the semiconductor film and arrive at the transparent conductive electrode being a back contact. The dye which has lost the electrons is reduced by redox ion (such as $I^-$ ion) in the electrolyte and receives electrons. The counter ion such as $I_3^-$ ion is again reduced on the counter electrode to generate iodine ion. As a consequence of the above electron flow, it is possible to obtain an outside current.

The electrolyte used in the photovoltaic conversion element contains a redox ion pair. Examples of the redox ion pair include iodine redox, bromine redox, iron redox, tin redox, chromium redox, vanadium redox, sulfide ion redox and anthraquinone redox but are not limited thereto. In the case of an iodine redox, a mixture of iodine with a imidazolium iodide derivative, lithium iodide, potassium iodide or an tetraalkylammonium iodide may be used as the electrolyte. In the case of a bromine redox, a mixture of bromine with an imidazolium bromide derivative, lithium bromide, potassium bromide or tetraalkylammonium bromide may be used. Preferably used is an iodine redox containing lithium iodide, tetraalkylammonium iodide or an imidazolium iodide.

The concentration of the above redox electrolyte is generally 0.05-5 M, preferably 0.1-0.5 M.

As an electrolyte solvent for dissolving the redox electrolyte, any solvent may be used as long as it is stable and can dissolve the electrolyte. Illustrative of suitable solvents are organic solvents such as acetonitrile, methoxyacetonitrile, propyonitrile, methoxypropionitrile, ethylene carbonate, propylene carbonate, dimethylsulfoxide, dimethylformamide, tetrahydrofuran and nitromethane and a mixed solvent thereof. A nitrile solvent is preferably used.

The counter electrode used in the photovoltaic conversion element of the present invention may be a film of platinum, rhodium, ruthenium or carbon coated on a conductive substrate, or an oxide semiconductor electrode. Preferably, a platinum or carbon electrode is used.

As a spacer used in the photovoltaic conversion element of the present invention, any material may be used as long as it can prevent a contact between the semiconductor film electrode and the counter electrode. For instance, a polymer film such as a polyethylene film may be used. The thickness of the film is 5-2000 μm, preferably 15-30 μm. In the case of a cell which is configured to prevent a contact between the semiconductor film electrode and the counter electrode, it is not necessary to use such a spacer.

In the photovoltaic conversion element of the present invention, a quasi-solid electrolyte obtained by gelling a redox electrolyte using a gelling agent may be used. In lieu of the redox electrolyte, there may be used a solid electrolyte using a polymer such as a polyethylene oxide derivative.

In the photovoltaic conversion element according to the present invention, a p-type inorganic semiconductor film of, for example, copper iodide, copper bromide or copper thiocyanate may be used in place of the redox electrolyte. Further, p-type organic semiconductor hole transport layer such as a polythiophene derivative or a polypyrrole derivative may be used in place of the redox electrolyte.

The dye-sensitized photovoltaic conversion element of the present invention may be applied to various sensors and photoelectrochemical solar cells.

EXAMPLE

The present invention will be next described in detail by reference examples and examples.

Reference Example 1

A coumarin derivative (2.5 g) of compound No. 57 shown below and having a formyl group at the 3-position thereof and a rhodanine derivative (2.04 g) of compound No. 58 shown below were dissolved in acetonitrile with heating, to which 0.8 ml of piperidine was added. The mixture was reacted for 1 hour under reflux and the reaction mixture was allowed to cool. The crystals thus precipitated were recovered by filtration. The crystals were dissolved in DMF (dimethylformamide) and the solution was filtered. The filtrate was mixed with acetonitrile, cooled and then filtered to obtain 3.1 g of vermilion crystals of the compound No. 1 shown above.

A part of the crystals was measured for melting point by the ordinary method. The melting point was 230 to 232° C. The visible light absorption spectrum in a methylene chloride solution showed the maximum absorption at 518 nm.

The proton nuclear magnetic resonance spectrum (hereinafter referred to as $^1$H-NMR spectrum) in deuterochloroform revealed peaks at the following positions: δ(TMS, ppm) 1.27 (6H, t), 3.51 (4H, q), 4.69 (2H, s), 6.51 (1H, s), 6.70 (1H, dd), 7.40-7.45 (3H, m).

Reference Example 2

A coumarin derivative (3.25 g) of compound No. 55 shown below and a rhodanine derivative (2 g) of compound No. 58 shown below were dissolved in acetonitrile with heating, to which 0.8 ml of piperidine was added. The mixture was reacted for 2 hour under reflux and the reaction mixture was allowed to cool. The crystals thus precipitated were recovered by filtration. The crystals were dissolved in chloroform and the solution was filtered. The filtrate was mixed with acetonitrile, cooled and then filtered to obtain 4.67 g of purple brown crystals of the compound No. 3 shown above.

A part of the crystals was measured for melting point by the ordinary method. The melting point was 244 to 246° C. The visible light absorption spectrum in a methylene chloride solution showed the maximum absorption at 540 nm. The $^1$H-NMR spectrum in deuterochloroform revealed peaks at the following positions: δ(TMS, ppm) 1.31 (6H, s), 1.54 (6H, s), 1.70-1.83 (4H, m), 3.30 (2H, t), 3.39 (2H, t), 4.68 (2H, s), 7.12 (1H, s), 7.62 (1H, s), 7.80 (1H, s).

Reference Example 3

A coumarin derivative (1 g) of compound No. 56 shown below and a cyanoacetic acid (0.36 g) of compound No. 59 shown below were dissolved in acetonitrile with heating, to which 0.1 ml of piperidine was added. The mixture was reacted for 1 hour under reflux. The crystals thus precipitated were recovered by filtration. The crystals were dissolved in DMF and the solution was filtered. The filtrate was mixed with isopropanol, and the crystals were filtered to obtain 0.42 g of brilliant purple crystals of the compound No. 7 shown above.

A part of the crystals was measured for melting point by the ordinary method. The melting point was 270 to 275° C. The visible light absorption spectrum in a methylene chloride solution showed the maximum absorption at 531 nm. The $^1$H-NMR spectrum in deuterochloroform revealed peaks at the following positions: δ(TMS, ppm) 1.31 (6H, s), 1.53 (6H, s), 1.74-1.85 (4H, m), 3.41-3.49 (4H, m), 7.47 (2H, m), 7.75 (1H, dd), 8.08 (1H, d), 8.22 (1H, s).

Reference Example 4

A coumarin derivative (3.3 g) of compound No. 55 shown below and a cyanoacetic acid (1.9 g) of compound No. 59 shown below were dissolved in acetonitrile with heating, to which 0.5 ml of piperidine was added. The mixture was reacted for 3 hours under reflux. During hot, the crystals thus precipitated were recovered by filtration. The crystals were dissolved in chloroform to which triethylamine had been added and the solution was purified by silica gel chromatography (elution liquid: chloroform-methanol mixed solvent) to obtain 0.99 g of brilliant red purple crystals of the compound No. 10 shown above.

A part of the crystals was measured for melting point by the ordinary method. The melting point was 186 to 192° C. The visible light absorption spectrum in a methanol solution showed the maximum absorption at 491 nm. The $^1$H-NMR spectrum in deuterochloroform revealed peaks at the following positions: δ(TMS, ppm) 1.28 (6H, s), 1.32 (9H, t), 1.54 (6H, s), 1.74 (2H, t), 1.80 (2H, t), 3.13 (6H, q), 3.23 (2H, t), 3.36 (2H, t), 7.19 (1H, s), 8.38 (1H, s), 8.75 (1H, s).

Example 1

As Example of the present invention, shown below is an example of a photo-electrochemical solar cell using a dye-sensitized semiconductor electrode in which the organic dye of compound No. 3 described above was adsorbed on a titanium dioxide film (thickness: 13 μm). As a comparative example, commercially available coumarin 343 (compound No. 60 shown below) was used.

Figure 2:
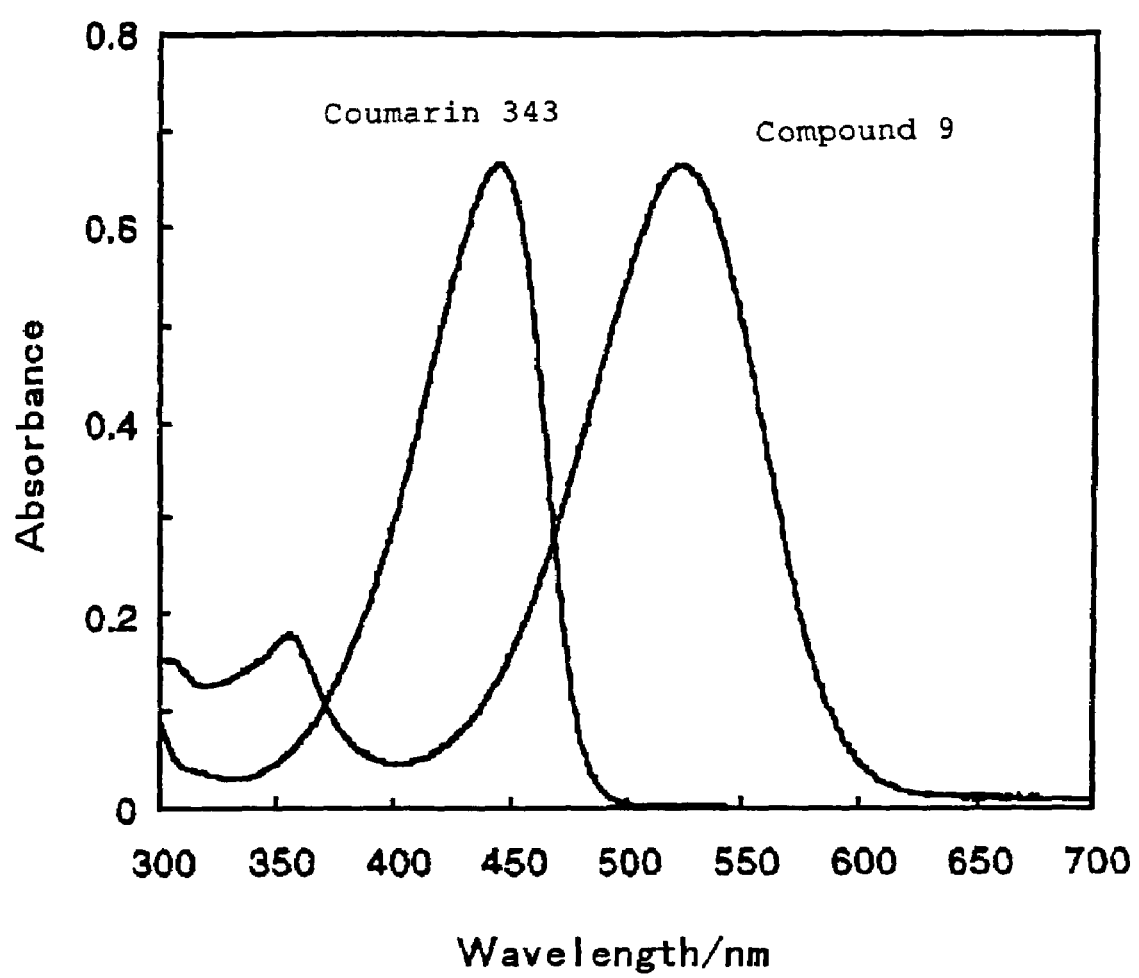
FIG. 2 shows absorption spectra of an ethanol solution of coumarin 343 and an ethanol solution of the specific organic dye used in the present invention.

FIG. 2 shows absorption spectra of coumarin 343 and compound No. 3 in ethanol. While the peak of the absorption wavelength is 440 nm in the case of coumarin 343, the peak is shifted toward a long wavelength side (to 530 nm) in the case of compound No. 3. From the standpoint of improving photovoltaic conversion efficiency, it is desired that a dye can absorb and utilize a wide range of wavelength. In particular, in the case of a solar cell, it is desired that a visible light (400-750 nm) which is rich in the solar beam can be absorbed as much as possible. In this sense, the organic dye of compound No. 3 is much suited as a photo sensitizer for a photovoltaic conversion element as compared to the known coumarin 343 and is expected to give higher efficiency.

In Table 1 given below, there are shown photovoltaic conversion characteristics of dye-sensitized photoelectrochemical solar cells which comprise a nanoporous titanium dioxide film electrode (thickness: 13 μm) sensitized with coumarin 343 or compound No. 3, an iodine redox electrolyte (solution of 0.3 M tetrapropylammonium iodide and 0.03 M iodine in a 6:4 (volume/volume) mixed solvent of ethylene carbonate:acetonitrile), a polyethylene spacer (thickness: 13 μm), and a platinum counter electrode. As a light source, pseudo-sunlight (100 mW/cm$^2$) using a solar simulator was used.

TABLE 1

| Dye | $J_{sc}$ (mA/cm$^2$) | $V_{oc}$ (V) | ff | η (%) |
|---|---|---|---|---|
| Coumarin 343 | 2.0 | 0.55 | 0.61 | 0.7 |
| Compound No. 3 | 3.6 | 0.60 | 0.71 | 1.5 |

As will be appreciated from Table 1, the solar cell using the conventional coumarin 343 gives a light short circuit current density $J_{sc}$ of 2.0 mA/cm$^2$, a light open circuit voltage $V_{oc}$ of 0.55 V, a fill factor of 0.61 and a solar energy conversion efficiency η of 0.7%. On the other hand, the solar cell using the organic dye of compound No. 3 according to the present invention gives a solar energy conversion efficiency η of 1.5% which is greater than that obtained using coumarin 343.

Example 2

In Table 2 given below, there are shown photovoltaic conversion characteristics of dye-sensitized photoelectrochemical solar cells which comprise a nanoporous titanium dioxide film electrode (thickness: 13 μm) sensitized with the organic dyes of compounds No. 1-7 and No. 10 shown above, an iodine redox electrolyte (solution of 0.3 M tetrapropylammonium iodide and 0.03 M iodine in a 6:4 (volume/volume) mixed solvent of ethylene carbonate:acetonitrile), a polyethylene spacer (thickness: 30 μm), and a platinum counter electrode, as measured under the condition of AM1.5 (100 mW/cm², light intensity similar to solar light).

TABLE 2

| Dye (Compound No.) | $J_{sc}$ (mA/cm²) | $V_{oc}$ (V) | ff | η (%) |
|---|---|---|---|---|
| 1 | 4.4 | 0.59 | 0.70 | 1.8 |
| 2 | 2.9 | 0.60 | 0.71 | 1.2 |
| 3 | 3.6 | 0.60 | 0.71 | 1.5 |
| 4 | 2.2 | 0.59 | 0.70 | 0.9 |
| 5 | 1.6 | 0.60 | 0.73 | 0.7 |
| 6 | 3.3 | 0.57 | 0.61 | 1.1 |
| 7 | 10.7 | 0.64 | 0.59 | 4.0 |
| 10 | 6.0 | 0.60 | 0.68 | 2.4 |

As will be apparent from Table 2, the photoelectrochemical solar cells using the dye-sensitized semiconductor electrodes having titanium dioxide films on which the compounds having the above-described specific structures (organic dyes) exhibit a high photovoltaic conversion efficiency. Especially remarkable is the fact that the conversion efficiency of the case in which sensitization is effected by the dye of the compound No. 7 is 4.0%. In the organic dyes of the compounds Nos. 1 to 6, the anchoring groups (—CH₂COOH and —C₂H₄COOH groups) at which the dye is adsorbed to semiconductor surfaces are bonded to the rhodanine ring and, therefore, the conjugation system is disconnected between the dye molecule and the anchoring group. In the case of the compounds Nos. 7 and 10, on the other hand, the —COOH group which is an anchoring group is directly bonded to the methine chain so that the conjugation system is not disconnected. It is considered that for this reason the flow of electron is accelerated. It is also believed that the presence of the CN group which is an electron attracting group has an effect of accelerating the implantation of electrons from the dye molecules to the semiconductor.

Example 3

In the above titanium dioxide solar cell using the dye of the compound No. 7 as a photosensitizer, the electrolyte was replaced by a methoxyacetonitrile solution containing 0.6 M dimethylpropylimidazolium iodide, 0.1 M lithium iodide and 0.05 M iodine. In this case, a light short circuit current density $J_{sc}$ of 15.0 mA/cm², a light open circuit voltage $V_{oc}$ of 0.59 V, a fill factor of 0.61 and a solar energy conversion efficiency η of 5.4% were obtained under the condition of AM 1.5.

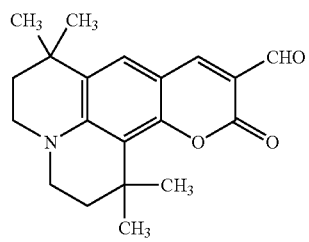

No. 55

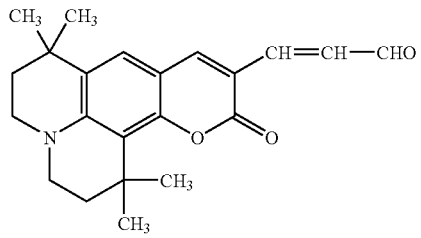

No. 56

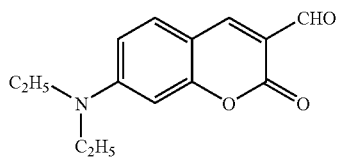

No. 57

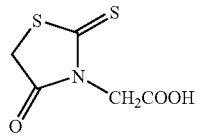

No. 58

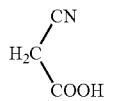

No. 59

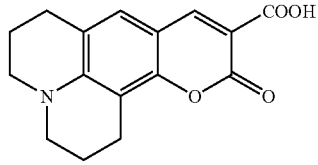

No. 60

According to the present invention, a dye-sensitized photovoltaic conversion element having a high photovoltaic conversion efficiency can be provided at a low cost by using the specific organic dye as a photosensitizer. By using this element, a photoelectrochemical solar cell having a high photovoltaic conversion efficiency may be easily provided.

BRIEF DESCRIPTION OF THE DRAWINGS

FIG. 1 is a schematic illustration of one embodiment of a photovoltaic conversion element of the present invention.

FIG. 2 shows absorption spectra of an ethanol solution of coumarin 343 and an ethanol solution of the specific organic dye used in the present invention.

The invention claimed is:

1. A film electrode comprising a semiconductor sensitized with an organic dye having a structure represented by the following formula (3):

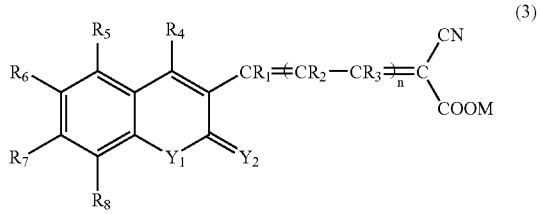

(3)

wherein $R_1$-$R_8$ each represent a hydrogen atom or a substituent or adjacent two of $R_1$-$R_8$ are taken in combination to represent a ring, $Y_1$ and $Y_2$ each represent a heteroatom, M represents a hydrogen atom or a salt-forming cation, and n is an integer of 0 to 3.

2. A photovoltaic conversion element comprising a film electrode according to claim 1.

3. A film electrode comprising a semiconductor sensitized with an organic dye having a structure represented by the following formula (6):

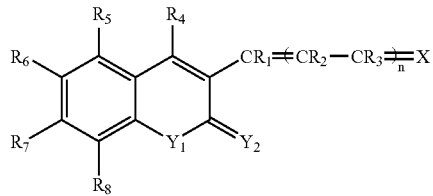

(6)

wherein $R_1$-$R_8$ each represent a hydrogen atom or a substituent or adjacent two of $R_1$-$R_8$ are taken in combination to represent a ring, X represents a heterocyclic group having at least one anionic group or anionic group-containing group and at least two heteroatoms, $Y_1$ and $Y_2$ each represent a heteroatom, and n is an integer of 0 to 3.

4. A photovoltaic conversion element comprising a film electrode according to claim 3.

5. A film electrode comprising a semiconductor sensitized with an organic dye having a structure represented by the following formula (7):

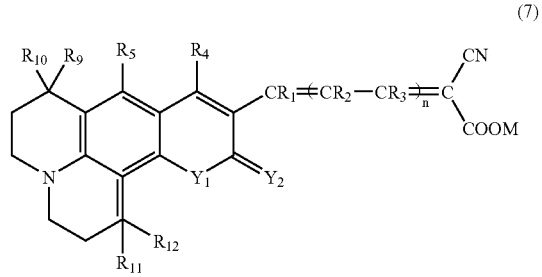

(7)

wherein $R_1$-$R_5$ each represent a hydrogen atom or a substituent or adjacent two of $R_1$-$R_3$ are taken in combination to represent a ring, $R_9$-$R_{12}$ each represent a hydrogen atom or an alkyl group having 1 to 6 carbon atoms, $Y_1$ and $Y_2$ each represent a heteroatom, M represents a hydrogen atom or a salt-forming cation, and n is an integer of 0 to 3.

6. A photovoltaic conversion element characterized by using a film electrode according to claim 5.

* * * * *